(12) United States Patent
Shur et al.

(10) Patent No.: US 9,042,420 B2
(45) Date of Patent: May 26, 2015

(54) DEVICE WITH TRANSPARENT AND HIGHER CONDUCTIVE REGIONS IN LATERAL CROSS SECTION OF SEMICONDUCTOR LAYER

(71) Applicant: Sensor Electronic Technology, Inc., Columbia, SC (US)

(72) Inventors: Michael Shur, Latham, NY (US); Maxim S. Shatalov, Columbia, SC (US); Alexander Dobrinsky, Loudonville, NY (US); Remigijus Gaska, Columbia, SC (US); Jinwei Yang, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 14/531,162

(22) Filed: Nov. 3, 2014

(65) Prior Publication Data
US 2015/0048309 A1    Feb. 19, 2015

Related U.S. Application Data

(63) Continuation of application No. 14/184,649, filed on Feb. 19, 2014, now Pat. No. 8,879,598, which is a continuation-in-part of application No. 13/572,446, filed on Aug. 10, 2012, now Pat. No. 8,787,418.

(Continued)

(51) Int. Cl.
*H01S 3/14* (2006.01)
*H01S 5/00* (2006.01)
(Continued)

(52) U.S. Cl.
CPC ............ *H01L 33/0025* (2013.01); *H01L 33/06* (2013.01); *H01L 33/32* (2013.01); *H01S 5/3216* (2013.01); *H01S 5/342* (2013.01)

(58) Field of Classification Search
CPC ........ H01S 5/3216; H01S 5/342; H01L 29/15
USPC ..................... 372/45.012, 46.015, 46.016, 68
See application file for complete search history.

(56) References Cited

U.S. PATENT DOCUMENTS 6,560,259 B1   5/2003   Hwang
7,812,366 B1   10/2010  Sampath et al.

(Continued)

FOREIGN PATENT DOCUMENTS

TW        201121101        6/2011

OTHER PUBLICATIONS

Chichibu et al., "Luminescences from localized states in InGaN epilayers", Appl. Phys. Lett., vol. 70, No. 21, May 26, 1997, pp. 2822-2824.

(Continued)

*Primary Examiner* — Armando Rodriguez
(74) *Attorney, Agent, or Firm* — LaBatt, LLC

(57) ABSTRACT

A device including one or more layers with lateral regions configured to facilitate the transmission of radiation through the layer and lateral regions configured to facilitate current flow through the layer is provided. The layer can comprise a short period superlattice, which includes barriers alternating with wells. In this case, the barriers can include both transparent regions, which are configured to reduce an amount of radiation that is absorbed in the layer, and higher conductive regions, which are configured to keep the voltage drop across the layer within a desired range.

23 Claims, 12 Drawing Sheets

Related U.S. Application Data

(60) Provisional application No. 61/768,692, filed on Feb. 25, 2013, provisional application No. 61/522,425, filed on Aug. 11, 2011, provisional application No. 61/600,701, filed on Feb. 19, 2012.

(51) Int. Cl.
*H01L 33/00* (2010.01)
*H01L 33/06* (2010.01)
*H01L 33/32* (2010.01)
*H01S 5/32* (2006.01)
*H01S 5/34* (2006.01)

(56) References Cited

U.S. PATENT DOCUMENTS

| | | |
|---|---|---|
| 2004/0140531 A1 | 7/2004 | Werner et al. |
| 2004/0159851 A1 | 8/2004 | Edmond et al. |
| 2006/0118820 A1 | 6/2006 | Gaska et al. |
| 2007/0295952 A1 | 12/2007 | Jang et al. |
| 2008/0093593 A1 | 4/2008 | Ryu |
| 2010/0320440 A1 | 12/2010 | Khan |
| 2011/0138341 A1 | 6/2011 | Shatalov et al. |
| 2011/0140076 A1 | 6/2011 | Song |
| 2011/0168979 A1 | 7/2011 | Shur et al. |
| 2011/0253975 A1 | 10/2011 | Shatalov et al. |
| 2011/0266520 A1 | 11/2011 | Shur et al. |
| 2011/0309326 A1 | 12/2011 | Gaska et al. |
| 2012/0113658 A1 | 5/2012 | Sakai |
| 2013/0292638 A1 | 11/2013 | Shur |

OTHER PUBLICATIONS

Chichibu et al., "Spatially resolved cathodoluminescence spectra of InGaN quantum wells", Appl. Phys. Lett., vol. 71, No. 16, Oct. 20, 1997, pp. 2346-2348.
Tamulaitis et al., "Optical bandgap formation in AlInGaN alloys", Appl. Phys. Lett., vol. 77, No. 14, Oct. 2, 2000, pp. 2136-2138.
Hirayama et al., "Marked enhancement of 320-360 nm ultraviolet emission in quaternary $In_xAl_yGa1-x-yN$ with In-segregation effect", Appl. Phys. Lett., vol. 80, No. 2, Jan. 14, 2002, pp. 207-209.
Ryu et al., "Luminescence mechanisms in quaternary $Al_xIn_yGa1-x-yN$ materials", Appl. Phys. Lett., vol. 80, No. 20, May 20, 2002, pp. 3730-3732.
Kim et al., "Dislocation behavior in InGaN/GaN multi-quantum-well structure grown by metalorganic chemical vapor deposition", Appl. Phys. Lett., vol. 80, No. 21, May 27, 2002, pp. 3949-3951.
Kazlauskas et al., "Double-scaled potential profile in a group-III nitride alloy revealed by Monte Carlo simulation of exciton hopping", Appl. Phys. Lett., vol. 83, No. 18, Nov. 3, 2003, pp. 3722-3724.
Sun et al., "Carrier dynamics of high-efficiency green light emission in graded-indium-content InGaN/GaN quantum wells: An important role of effective carrier transfer", Appl. Phys. Lett., vol. 84, No. 1, Jan. 5, 2004, pp. 49-51.

Chen et al., "Mechanism of enhanced luminescence in $In_xAl_yGa1-x-yN$ quaternary epilayers", Appl. Phys. Lett., vol. 84, No. 9, Mar. 1, 2004, pp. 1480-1482.
Waltereit et al., "Blue GaN-based light-emitting diodes grown by molecular-beam epitaxy with external quantum efficiency greater than 1.5%", Appl. Phys. Lett., vol. 84, No. 15, Apr. 15, 2004, pp. 2748-2750.
Collins et al., "Enhanced room-temperature luminescence efficiency through carrier localization in $Al_xGa1-xN$ alloys", Appl. Phys. Lett. 86, 031916~2005, 4 pgs.
Lee et al., "Carrier transport by formation of two-dimensional hole gas in p-type Al0.1Ga0.9N/GaN superlattice for AlGaInN-based laser diode", Journal of Crystal Growth 287 (2006) 554-557.
Sampath et al., "Characterization of nanometer scale compositionally inhomogeneous AlGaN active regions on bulk AlN substrates", Solid-State Electronics 54 (2010) 1130-1134.
Shen, et al., "Mechanisms of Enhanced Luminescence in Nanoscale Compositionally Inhomogeneous AlGaN", ECS Trans. 2006, vol. 3, Issue 5, pp. 181-187.
Lee et al., "Investigation of optical andelectrical properties of Mg-doped p-$In_xGa1-xN$, p-GaN andp-$Al_yGa1-yN$ grown by MOCVD", Journal of Crystal Growth 272 (2004) 455-459.
Monroy et al., "Molecular-beam epitaxial growth and characterization of quaternary III-nitride compounds", J. Appl. Phys., vol. 94, No. 5, Sep. 1, 2003, pp. 3121-3127.
Bell et al., "Exciton freeze-out and thermally activated relaxation at local potential fluctuations in thick $Al_xGa1-xN$ layers", J. Appl. Phys., vol. 95, No. 9, May 1, 2004, pp. 4671-4674.
Pinos et al., "Localization potentials in AlGaN epitaxial films studied by scanning nearfield optical spectroscopy", J. Appl. Phys. 109, 113516 (2011), 8 pgs.
Lee et al., "Fabrication of High-Output-Power AlGaN/GaN-Based UV-Light-Emitting Diode Using a Ga Droplet Layer", Jpn. J. Appl. Phys. vol. 41 (2002) pp. L 1037-L 1039, Part 2, No. 10A, Oct. 1, 2002.
Sampath et al., "Growth of AlGaN containing nanometer scale compositional inhomogeneities for ultraviolet light emitters", J. Vac. Sci. Technol. B 29 (3), May/Jun. 2011, 5 pages.
Oh et al., "Mg concentration dependence of optical properties in GaN : Mg", Journal of Crystal Growth 189/190 (1998) 537-540.
Cho et al., "Dynamics of anomalous optical transitions in $Al_xGa1-xN$ alloys", Physical Review B, vol. 61, No. 11, March 15, 2000, 4 pages.
Park, International Application No. PCT/US2012/050486, International Search Report and the Written opinion of the International Searching Authority, SETI-0074-PCT, Jan. 29, 2013, 10 pages.
Rodriguez, USPTO Office Action for U.S. Appl. No. 13/572,446, Jan. 2, 2014, 21 pages.
Rodriguez, Notice of Allowance for U.S. Appl. No. 13/572,446, Mar. 24, 2014, 9 pages.
English translation of Office Action of the Intellectual Property Office of Taiwan, Taiwan Application No. 101129256, Aug. 11, 2014, 2 pages.
Rodriguez, USPTO Notice of Allowance for U.S. Appl. No. 14/184,649, Jul. 8, 2014, 16 pages.

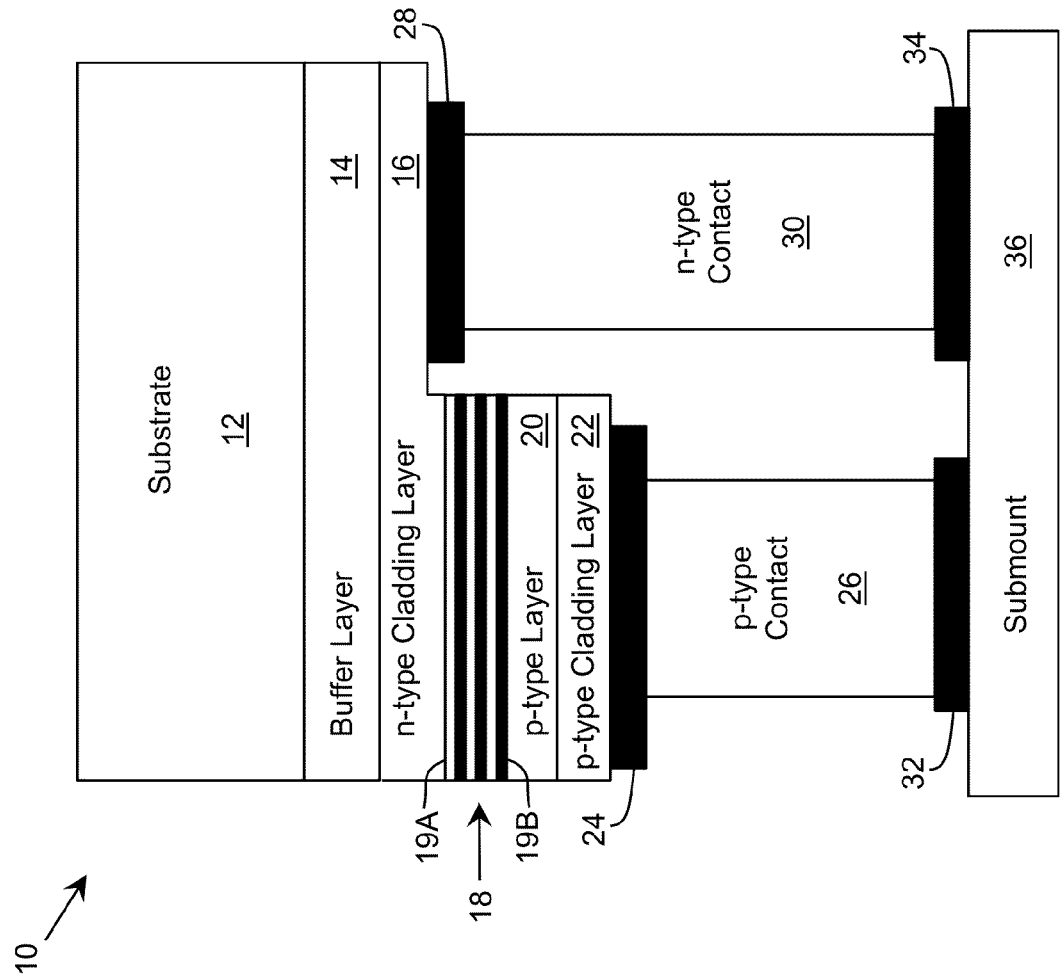

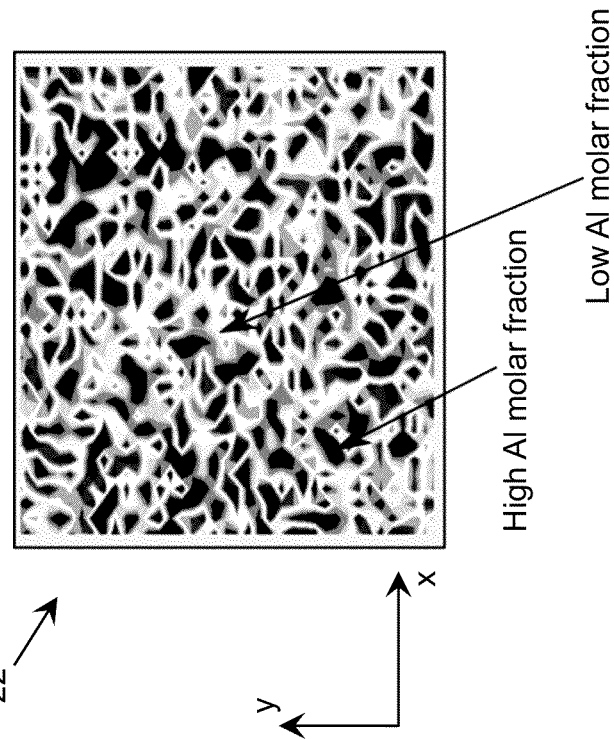
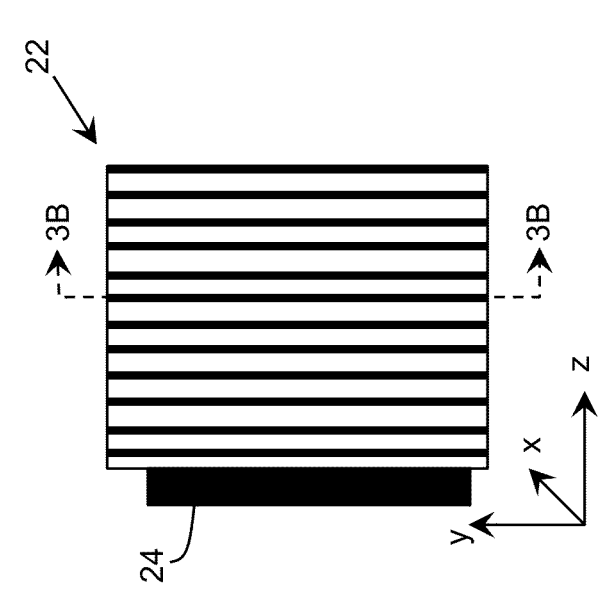

DEVICE WITH TRANSPARENT AND HIGHER CONDUCTIVE REGIONS IN LATERAL CROSS SECTION OF SEMICONDUCTOR LAYER

REFERENCE TO RELATED APPLICATIONS

The current application is a continuation of co-pending U.S. application Ser. No. 14/184,649, titled "Emitting Device with Compositional and Doping Inhomogeneities in Semiconductor Layers," which was filed on 19 Feb. 2014, which claims the benefit of U.S. Provisional Application No. 61/768,692, titled "Emitting Device with Compositional and Doping Inhomogeneities in Semiconductor Layers," which was filed on 25 Feb. 2013, and which is a continuation-in-part of co-pending U.S. application Ser. No. 13/572,446, titled "Emitting Device with Compositional and Doping Inhomogeneities in Semiconductor Layers," which was filed on 10 Aug. 2012, and which claims the benefit of U.S. Provisional Application No. 61/522,425, titled "Light Emitting Diodes with Compositional and Doping Inhomogeneities in Semiconductor Layers," which was filed on 11 Aug. 2011 and U.S. Provisional Application No. 61/600,701, titled "Light Emitting Diodes with Compositional and Doping Inhomogeneities in Semiconductor Layers," which was filed on 19 Feb. 2012, each of which is hereby incorporated by reference.

GOVERNMENT LICENSE RIGHTS

This invention was made with government support under contract no. W911 NF-10-2-0023 awarded by the Defense Advanced Research Projects Agency (DARPA). The government has certain rights in the invention.

TECHNICAL FIELD

The disclosure relates generally to emitting devices, and more particularly, to an emitting device with improved efficiency.

BACKGROUND ART

Semiconductor emitting devices, such as light emitting diodes (LEDs) and laser diodes (LDs), include solid state emitting devices composed of group III-V semiconductors. A subset of group III-V semiconductors includes group III nitride alloys, which can include binary, ternary and quaternary alloys of indium (In), aluminum (Al), gallium (Ga), and nitrogen (N). Illustrative group III nitride based LEDs and LDs can be of the form $In_yAl_xGa_{1-x-y}N$, where x and y indicate the molar fraction of a given element, $0 \le x$, $y \le 1$, and $0 \le x+y \le 1$. Other illustrative group III nitride based LEDs and LDs are based on boron (B) nitride (BN) and can be of the form $Ga_zIn_yAl_xB_{1-x-y-z}N$, where $0 \le x, y, z \le 1$, and $0 \le x+y+z \le 1$.

An LED is typically composed of semiconducting layers. During operation of the LED, an applied bias across doped layers leads to injection of electrons and holes into an active layer where electron-hole recombination leads to light generation. Light is generated with uniform angular distribution and escapes the LED die by traversing semiconductor layers in all directions. Each semiconducting layer has a particular combination of molar fractions (e.g., x, y, and z) for the various elements, which influences the electronic and optical properties of the layer. In particular, the refractive index and absorption characteristics of a layer are sensitive to the molar fractions of the semiconductor alloy. Variation of the molar fraction throughout a layer results in variation in the index of refraction and the band gap energy of the layer.

Ultraviolet LEDs are typically grown using group III-V semiconductor layers such as layers of $Al_xGa_{1-x}N$. It was found that the material properties of $Al_xGa_{1-x}N$ alloys change as the amount of aluminum in the alloy is increased. With proper growth conditions, it also was found that the aluminum did not incorporate uniformly throughout the AlGaN layer (i.e., the material has areas of high and low concentrations of aluminum spread throughout). These compositional fluctuations, together with doping fluctuations, also known as localized inhomogeneities, result in carrier localization and lead to the creation of conduction layers for carriers.

The effect of compositional fluctuations have been well studied for blue LEDs with pioneering work of S. Chichibu, T. Azuhata, T. Sota and S. Nakamura, Applied Physics Letters. 1997 May 1, 70, 2822; S. Chichibu, K. Wada, and S. Nakamura, Applied Physics Letters, vol. 71, pp. 2346-2348, Oct. 1997, each of which is incorporated herein by reference in its entirety. The localization effect resulting from the creation of localized inhomogeneities has natural occurrence for InAlGaN alloys attributed to indium segregation. These effects have been reported in works of E. Monroy, N. Gogneau, F. Enjalbert, F. Fossard, D. Jalabert, E. Bellet-Amalric, Le Si Dang, and B. Daudin, J. Appl. Phys. 94, 3121 (2003); Mee-Yi Ryu, C. Q. Chen, E. Kuokstis, J. W. Yang, G. Simin, and M. Asif Khan, Appl. Phys. Lett. 80, 3730 (2002); H. Hirayama, A. Kinoshita, T. Yamabi, Y. Enomoto, A. Hirata, T. Araki, Y. Nanishi, and Y. Aoyagi, Appl. Phys. Lett. 80, 207 (2002); C. H. Chen, Y. F. Chen, Z. H. Lan, L. C. Chen, K. H. Chen, H. X. Jiang, and J. Y. Lin, Appl. Phys. Lett. 84, 1480 (2004), each of which is incorporated herein by reference in its entirety. Further, small additions of indium were shown to smooth out the band-bottom potential profile in AlInGaN layers owing to improved crystal quality. The effect of incorporation of 1% of indium to AlGaN semiconductor layer also has been studied. Similar to other studies, the creation of compositional inhomogeneities in a semiconductor layer with distinct double-scaled potential profile was observed, which indicates that indium atoms produce clusters of uniform consistency interspersed in AlGaN background semiconductor alloy.

During the growth process of AlGaN semiconductor layers, small islands with high aluminum content are formed. See A. Pinos, V. Liuolia, S. Marcinkevičius, J. Yang, R. Gaska, and M. S. Shur, Journal of Applied Physics, vol. 109, no. 11, p. 113516, 2011), which is incorporated herein by reference in its entirety. Grains with high aluminum content are separated by domain boundaries containing extended defects, which are formed in order to accommodate the relative difference in crystal orientation among the islands. These defects have high gallium content.

Details of compositional fluctuation in AlGaN semiconductors have been studied by photoluminescence (PL) measured using scanning near field optical microscopy (SNOM). Using this technique, the band gap fluctuations were observed to be of order of 50 meV. The fluctuations increase with higher aluminum content. For samples with low aluminum content (less than 0.4 molar fraction), the small-scale fluctuations occur within larger domains and are believed to be due to an inhomogeneous stress field and dislocations. For the aluminum molar fraction of 0.42 and higher, the small-scale potential variations were observed over the whole sample and assigned to the formation of Al-rich grains during the growth. Larger area potential variations of 25-40 meV, most clearly observed in the layers with a lower AlN molar fraction, have been attributed to Ga-rich regions close to grain boundaries or atomic layer steps. Analysis of the PL spectra allows evaluating average potential fluctuations due to inhomogeneous growth of AlGaN layers. Some findings suggest that there are two spatial scales of potential fluctuation—large scale of order of 1 μm and small scale that is less than 100 nm. Potential fluctuations reach amplitudes of few tens of meV at each scale.

FIG. 1 shows a schematic of compositional fluctuation according to the prior art. During the initial growth stage, adjacent small islands, from which the growth starts, coalesce into larger grains. As the islands enlarge, Ga adatoms, having a larger lateral mobility than Al adatoms, reach the island boundaries more rapidly, thus the Ga concentration in the coalescence regions is higher than in the center of the islands. The composition pattern, which is formed during the coalescence, is maintained as the growth proceeds vertically. As a result of the coalescence, the domain boundaries usually contain extended defects that form to accommodate the relative difference in crystal orientation among the islands. Even in layers with smooth surfaces containing elongated layer steps, screw/mixed dislocations occur due to the local compositional inhomogeneities.

High magnesium doping can lead to the creation of minibands originating from the discrete acceptor levels. A red shift in room temperature photoluminescence spectra has been observed giving an indication that miniband levels are emerging for acceptor concentration levels of the order of $n=10^{19}-10^{20}$ ($1/cm^3$). In high acceptor concentration domains, hole wavefunctions may overlap thus forming hole conduction pathways through the material. These pathways lead to an increase of conductivity through semiconductor layers.

SUMMARY OF THE INVENTION

In light of the above, the inventors recognize that compositional and/or doping inhomogeneities allow for the development of conduction channels, e.g., in p-type superlattice layers. At the same time, the regions high in aluminum content allow for low light absorption (e.g., a higher transmission coefficient). The inventors propose to achieve a desired balance of higher conduction with reduced light absorption by tailoring semiconductor properties through the use of composite inhomogeneities, thereby obtaining a more optimal semiconductor material for light emitting/transmission applications.

Aspects of the invention provide a device including one or more layers with lateral regions configured to facilitate the transmission of radiation through the layer and lateral regions configured to facilitate current flow through the layer. The layer can comprise a short period superlattice, which includes barriers alternating with wells. In this case, the barriers can include both transparent regions, which are configured to reduce an amount of radiation that is absorbed in the layer, and higher conductive regions, which are configured to keep the voltage drop across the layer within a desired range.

A first aspect of the invention provides a device comprising: a short period superlattice (SPSL) semiconductor layer comprising a plurality of barriers, wherein a composition of at least one barrier varies along the lateral dimensions of the at least one barrier such that a lateral cross section of the at least one barrier includes: a set of transparent regions, each transparent region having a transmission coefficient for a target radiation wavelength, l, greater than or equal to approximately sixty percent, wherein the set of transparent regions are at least ten percent of an area of the lateral cross section of the at least one barrier; and a set of higher conductive regions occupying a sufficient area of the area of the lateral cross section of the at least one barrier and having an average resistance per unit area to a vertical current flow resulting in a total voltage drop across the SPSL of less than approximately five volts.

A second aspect of the invention provides a device comprising: a short period superlattice (SPSL) semiconductor layer comprising a plurality of barriers, wherein a lateral cross section of each barrier includes: a set of transparent regions, each transparent region having a transmission coefficient for a target radiation wavelength, l, greater than or equal to approximately sixty percent, wherein the set of transparent regions are at least ten percent of an area of the lateral cross section of the barrier; and a set of higher conductive regions occupying a sufficient area of the area of the lateral cross section of the barrier and having an average resistance per unit area to a vertical current flow resulting in a total voltage drop across the SPSL of less than approximately five volts.

A third aspect of the invention provides a method of fabricating a device comprising: forming a short period superlattice (SPSL) semiconductor layer comprising a plurality of barriers, wherein a lateral cross section of each barrier includes: a set of transparent regions, each transparent region having a transmission coefficient for a target radiation wavelength, l, greater than or equal to approximately sixty percent, wherein the set of transparent regions are at least ten percent of an area of the lateral cross section of the barrier; and a set of higher conductive regions occupying a sufficient area of the area of the lateral cross section of the barrier and having an average resistance per unit area to a vertical current flow resulting in a total voltage drop across the SPSL of less than approximately five volts.

A fourth aspect of the invention provides a device comprising: a short period superlattice (SPSL) semiconductor layer comprising a plurality of barriers, wherein a composition of at least one barrier varies along lateral dimensions of the at least one barrier such that a lateral cross section of the at least one barrier includes: a set of transparent regions having a first characteristic band gap, wherein the set of transparent regions are at least ten percent of an area of the lateral cross section of the at least one barrier; and a set of higher conductive regions having a second characteristic band gap at least five percent smaller than the first characteristic band gap, wherein the set of higher conductive regions occupies a sufficient area of the area of the lateral cross section of the at least one barrier to keep a voltage drop across the SPSL within a target range, and wherein lateral inhomogeneities in at least one of: the composition or a doping of the at least one barrier forms the set of transparent regions and the set of higher conductive regions.

A fifth aspect of the invention provides a device comprising: a short period superlattice (SPSL) semiconductor layer comprising a plurality of barriers, wherein a lateral cross section of each barrier includes: a set of transparent regions, wherein the set of transparent regions are at least ten percent of an area of the lateral cross section of the at least one barrier; and a set of higher conductive regions occupying a sufficient area of the area of the lateral cross section of the at least one barrier to keep a voltage drop across the SPSL within a target range, wherein a characteristic distance between two higher conductive regions in the set of higher conductive regions is less than a lateral current spreading length.

A sixth aspect of the invention provides a method of fabricating a device comprising: forming a short period superlattice (SPSL) semiconductor layer comprising a plurality of barriers, wherein a lateral cross section of each barrier includes: a set of transparent regions, wherein the set of transparent regions are at least ten percent of an area of the lateral cross section of the at least one barrier; and a set of higher conductive regions occupying a sufficient area of the area of the lateral cross section of the at least one barrier to keep a voltage drop across the SPSL within a target range, wherein a characteristic distance between two higher conductive regions in the set of higher conductive regions is less than a lateral current spreading length.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 2 shows a schematic structure of an illustrative emitting device according to an embodiment.

FIGS. 3A and 3B show illustrative schematic representations of a p-type layer formed using a p-type superlattice according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
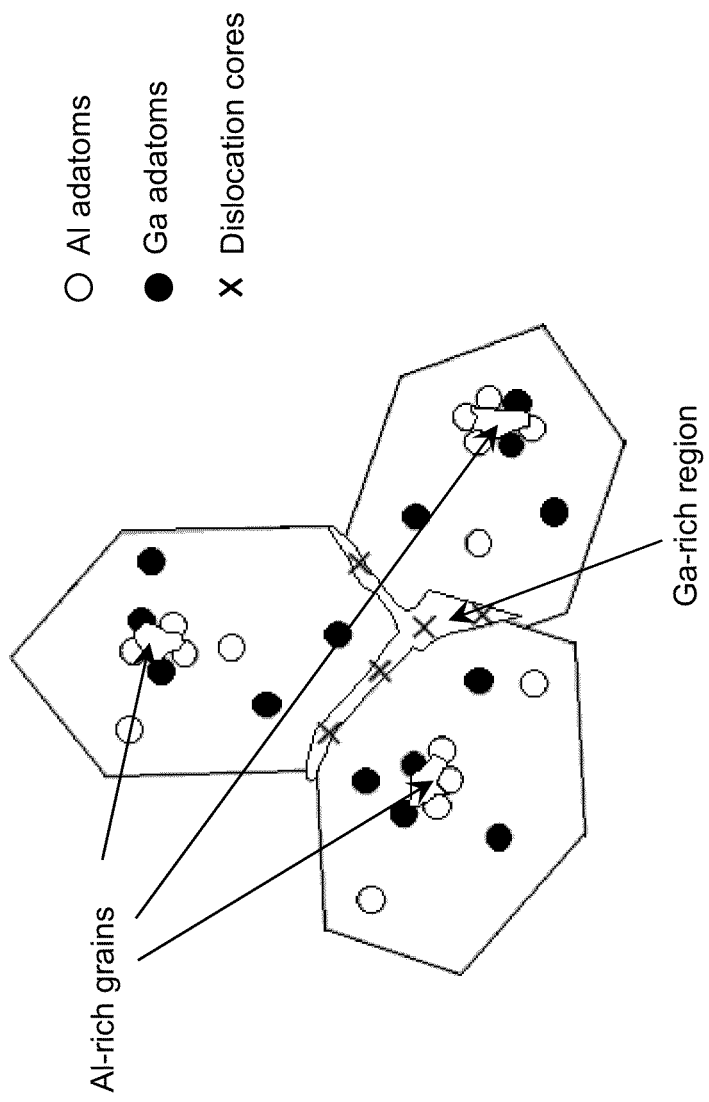
FIG. 1 shows a schematic of compositional fluctuation according to the prior art.

As indicated above, aspects of the invention provide a device including one or more layers with lateral regions configured to facilitate the transmission of radiation through the layer and lateral regions configured to facilitate current flow through the layer. The layer can comprise a short period superlattice, which includes barriers alternating with wells. In this case, the barriers can include both transparent regions, which are configured to reduce an amount of radiation that is absorbed in the layer, and higher conductive regions, which are configured to keep the voltage drop across the layer within a desired range. As used herein, unless otherwise noted, the term "set" means one or more (i.e., at least one) and the phrase "any solution" means any now known or later developed solution.

Turning to the drawings, FIG. 2 shows a schematic structure of an illustrative emitting device 10 according to an embodiment. In a more particular embodiment, the emitting device 10 is configured to operate as a light emitting diode (LED), such as a conventional or super luminescent LED. Alternatively, the emitting device 10 can be configured to operate as a laser diode (LD). In either case, during operation of the emitting device 10, application of a bias comparable to the band gap results in the emission of electromagnetic radiation from an active region 18 of the emitting device 10. The electromagnetic radiation emitted by the emitting device 10 can comprise a peak wavelength within any range of wavelengths, including visible light, ultraviolet radiation, deep ultraviolet radiation, infrared light, and/or the like. In an embodiment, the device is configured to emit radiation having a dominant wavelength within the ultraviolet range of wavelengths. In a more specific embodiment, the dominant wavelength is within a range of wavelengths between approximately 210 and approximately 350 nanometers.

The emitting device 10 includes a heterostructure comprising a substrate 12, a buffer layer 14 adjacent to the substrate 12, an n-type cladding layer 16 (e.g., an electron supply layer) adjacent to the buffer layer 14, and an active region 18 having an n-type side 19A adjacent to the n-type cladding layer 16. Furthermore, the heterostructure of the emitting device 10 includes a p-type layer 20 (e.g., an electron blocking layer) adjacent to a p-type side 19B of the active region 18 and a p-type cladding layer 22 (e.g., a hole supply layer) adjacent to the p-type layer 20.

In a more particular illustrative embodiment, the emitting device 10 is a group III-V materials based device, in which some or all of the various layers are formed of elements selected from the group III-V materials system. In a still more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \leq W, X, Y, Z \leq 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 includes an active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, both the n-type cladding layer 16 and the p-type layer 20 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, and 20. The substrate 12 can be sapphire, silicon carbide (SiC), silicon (Si), GaN, AlGaN, AlON, $LiGaO_2$, or another suitable material, and the buffer layer 14 can be composed of AlN, an AlGaN/AlN superlattice, and/or the like.

As shown with respect to the emitting device 10, a p-type metal 24 can be attached to the p-type cladding layer 22 and a p-type contact 26 can be attached to the p-type metal 24. Similarly, an n-type metal 28 can be attached to the n-type cladding layer 16 and an n-type contact 30 can be attached to the n-type metal 28. The p-type metal 24 and the n-type metal 28 can form ohmic contacts to the corresponding layers 22, 16, respectively. In an embodiment, the p-type metal 24 and the n-type metal 28 each comprise several conductive and reflective metal layers, while the n-type contact 30 and the p-type contact 26 each comprise highly conductive metal. In an embodiment, the p-type cladding layer 22 and/or the p-type contact 26 can be at least partially transparent (e.g., semi-transparent or transparent) to the electromagnetic radiation generated by the active region 18. For example, the p-type cladding layer 22 and/or the p-type contact 26 can comprise a short period superlattice lattice structure, such as an at least partially transparent magnesium (Mg)-doped AlGaN/AlGaN short period superlattice structure (SPSL). Furthermore, the p-type contact 26 and/or the n-type contact 30 can be at least partially reflective of the electromagnetic radiation generated by the active region 18. In another embodiment, the n-type cladding layer 16 and/or the n-type contact 30 can be formed of a short period superlattice, such as an AlGaN SPSL, which is at least partially transparent to the electromagnetic radiation generated by the active region 18.

As used herein, a layer is at least partially transparent when the layer allows at least a portion of electromagnetic radiation in a corresponding range of radiation wavelengths to pass there through. For example, a layer can be configured to be at least partially transparent to a range of radiation wavelengths corresponding to a peak emission wavelength for the light (such as ultraviolet light or deep ultraviolet light) emitted by the active region 18 (e.g., peak emission wavelength +/− five nanometers). As used herein, a layer is at least partially transparent to radiation if it allows more than approximately 0.5 percent of the radiation to pass there through. In a more particular embodiment, an at least partially transparent layer is configured to allow more than approximately five percent of the radiation to pass there through. Similarly, a layer is at least partially reflective when the layer reflects at least a portion of the relevant electromagnetic radiation (e.g., light having wavelengths close to the peak emission of the active region). In an embodiment, an at least partially reflective layer is configured to reflect at least approximately five percent of the radiation.

As further shown with respect to the emitting device 10, the device 10 can be mounted to a submount 36 via the contacts 26, 30. In this case, the substrate 12 is located on the top of the emitting device 10. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like.

Any of the various layers of the emitting device 10 can comprise a substantially uniform composition or a graded composition. For example, a layer can comprise a graded composition at a heterointerface with another layer. In an embodiment, the p-type layer 20 comprises a p-type blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the emitting device 10 described herein is only illustrative. To this extent, an emitting device/heterostructure can include an alternative layer configuration, one or more additional layers, and/or the like. As a result, while the various layers are shown immediately adjacent to one another (e.g., contacting one another), it is understood that one or more intermediate layers can be present in an emitting device/heterostructure. For example, an illustrative emitting device/heterostructure can include an undoped layer between the active region 18 and one or both of the p-type cladding layer 22 and the electron supply layer 16.

Furthermore, an emitting device/heterostructure can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the p-type cladding layer 22 and the active region 18. Similarly, a device/heterostructure can include a p-type layer located between the p-type cladding layer 22 and the active region 18. The DBR structure and/or the p-type layer can comprise any composition based on a desired wavelength of the light generated by the device/heterostructure. In one embodiment, the DBR structure comprises a Mg, Mn, Be, or Mg+Si-doped p-type composition. The p-type layer can comprise a p-type AlGaN, AlInGaN, and/or the like. It is understood that a device/heterostructure can include both the DBR structure and the p-type layer (which can be located between the DBR structure and the p-type cladding layer 22) or can include only one of the DBR structure or the p-type layer. In an embodiment, the p-type layer can be included in the device/heterostructure in place of an electron blocking layer. In another embodiment, the p-type layer can be included between the p-type cladding layer 22 and the electron blocking layer.

Regardless, as described herein, one or more of the semiconductor layers of the device 10 can comprise nano-scale and/or micron-scale localized compositional and/or doping inhomogeneities along the lateral dimensions of the device die. For example, a semiconductor layer can be p-doped with magnesium or n-doped with silicon to create the inhomogeneities. These inhomogeneities provide variation of band gap energy in a lateral direction of the layer, which results in a complicated energy landscape for a lateral cross section of the layer. In particular, the inhomogeneities will result in lower band gap regions, which become places of charge localization and form a set of higher conductive regions of carrier conductive channels in the semiconductor layer. These higher conductive regions have an improved vertical conductivity over that of a substantially homogenous layer of the material. Additionally, the inhomogeneities also will result in high band gap regions, which form a set of at least partially transparent regions within the layer, each of which has an improved vertical transparency over that of a substantially homogenous layer of the material.

Inclusion of the inhomogeneities in one or more of the semiconductor layers of the device 10 can result in an improvement in the efficiency of the device 10. The inhomogeneities can be included in any layer of the semiconductor device 10. To this extent, the inhomogeneities can be included in a superlattice region, a nucleation region, a buffer layer, a cladding layer, an active region, and/or the like of the device 10. In an embodiment, the inhomogeneities are incorporated into one or more injection layers, such as the n-type cladding layer 16, the p-type layer 20, the p-type cladding layer 22, the n-type contact 30, the p-type contact 26, and/or the like.

In an illustrative embodiment described further herein, the inhomogeneities are incorporated into a layer formed using a p-type superlattice, such as the p-type cladding layer 22. For example, the p-type cladding layer 22 can comprise a periodic structure composed of a set of barriers alternating with a set of wells. In a more specific embodiment, the sets of barriers and wells are each formed of a group III nitride material where each barrier comprises a higher aluminum content (molar fraction) than the adjacent well(s). In a still more specific embodiment, each barrier and well in the periodic structure can have a thickness less than approximately three nanometers. The p-type cladding layer 22 can be modulation p-doped with magnesium to incorporate the inhomogeneities. In an embodiment, the doping is such that a concentration of magnesium in the barrier regions is higher than $5 \cdot 10^{18}$ [$1/cm^3$] and a concentration of magnesium in the well regions is lower than $5 \cdot 10^{15}$ [$1/cm^3$].

FIGS. 3A and 3B show illustrative schematic representations of the p-type cladding layer 22 formed using a p-type superlattice according to an embodiment. The p-type cladding layer 22 is shown adjacent to the p-type metal 24. In FIGS. 3A and 3B, areas with a high aluminum composition are indicated by the dark regions, while areas with a low aluminum composition are indicated by the lighter/bright regions. To this extent, FIG. 3A illustrates variation in aluminum composition within the layer 22 along the height of the layer (e.g., indicated by direction z) in a direction normal to a surface of the layer 22 adjacent to the p-type metal 24. In particular, the p-type cladding layer 22 can be formed of a p-type $Al_xGa_{1-x}N/Al_yGa_{1-y}N$ superlattice, where molar fractions x and y correspond to the molar fractions of barriers and wells, respectively, and where the molar fraction x is greater than the molar fraction y. Each barrier and well can be approximately a few nanometers in thickness. For example, the wells can have a thickness in a range between approximately one and approximately six nanometers, and the barriers can have a thickness in a range between approximately five and approximately twenty nanometers.

FIG. 3B illustrates variation in the aluminum composition of the p-type cladding layer 22 in the lateral directions (e.g., indicated by directions x and y) of the layer 22. FIG. 3B can correspond to a lateral cross section of the layer 22 taken along a barrier of the layer 22. As used herein, the term lateral means the plane of the layer 22 that is substantially parallel with the surface of the layer 22 adjacent to another layer of the device 10 (FIG. 2), such as the surface of the layer 22 adjacent to the p-type metal 24. As illustrated, the lateral cross section of the layer 22 includes a set of transparent regions, which correspond to those regions having a relatively high aluminum content, and a set of higher conductive regions, which correspond to those regions having a relatively low aluminum content.

The set of transparent regions can be configured to allow a significant amount of the radiation to pass through the layer 22, while the set of higher conductive regions can be configured to keep the voltage drop across the layer 22 within a desired range (e.g., less than five volts). In an embodiment, the total voltage drop across the layer 22 is less than ten percent of the total voltage drop across the entire device. In an embodiment, the set of transparent regions occupy at least ten percent of the lateral area of the layer 22, while the set of higher conductive regions occupy at least approximately two percent (five percent in a more specific embodiment) of the lateral area of the layer 22. Furthermore, in an embodiment, a band gap of the higher conductive regions is at least five percent smaller than the band gap of the transparent regions. In a more particular embodiment, the transparent regions comprise a transmission coefficient for radiation of a target wavelength higher than approximately fifty percent (sixty percent in another embodiment and eighty percent in a still more particular embodiment), while the higher conductive regions have a resistance per unit area to vertical current flow that is smaller than approximately $10^{-2}$ ohm·$cm^2$. As used herein, the term transmission coefficient means the ratio of an amount of radiation exiting of the region to an amount of radiation entering the region.

The set of transparent regions can be configured to form a photonic crystal. The photonic crystal can be configured to reduce an amount of radiation that is absorbed in the layer 22 by dispersing the radiation. The photonic crystal can be configured to form a lattice with at least one characteristic size T1 and a photonic crystal lattice vector a, wherein, in an embodiment, the characteristic size T1 can be on the order of the target radiation wavelength. Additionally, the lattice vector a can be on the order of the target radiation wavelength. While various photonic crystal embodiments are possible, the most readily manufactured is a photonic crystal comprising hexagonally positioned cylindrical transparent regions. It is understood that the photonic crystal may be imperfect, comprise transparent regions of non-similar shapes varying in size by as much as a few hundred percent separated by a characteristic distance that can vary throughout the material by as much as several hundred percent. It is also understood that the set of transparent regions can be manufactured using any solution, including one or more of: patterning, masking, epitaxial overgrowth combined with techniques such as thermal evaporation, magnetron sputtering, ion-beam deposition, laser beam evaporation, and/or the like.

Figure 5:
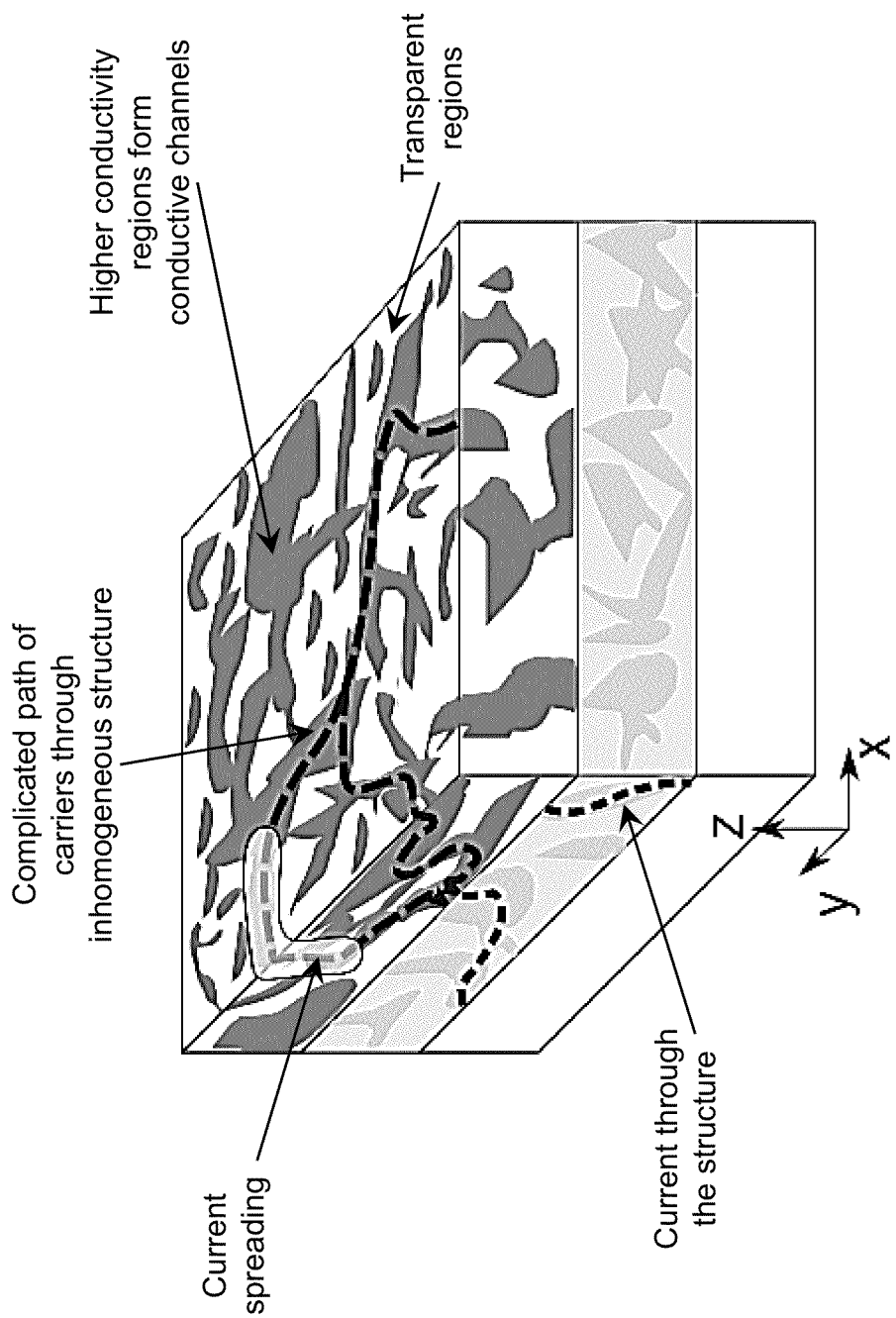
FIG. 5 shows a schematic representation of an illustrative carrier path in a complicated energy landscape caused by the inhomogeneities according to an embodiment.

The set of transparent regions can be interspersed with the set of higher conductive regions to form a interconnected network of conductive paths. FIG. 5 shows a schematic representation of an illustrative carrier path in a complicated energy landscape caused by the inhomogeneities according to an embodiment. As shown, the set of higher conductive regions (darker regions) are interspersed with the set of transparent regions (lighter regions) to form conductive channels for the interconnected network. The interconnected network of conductive paths allows for conductivity throughout the semiconductor layer (e.g., layer 22) containing the set of transparent regions. As used herein, the terms "interconnected network", "interconnected domain", or similar expressions describe domains including multiple smaller percolated regions, separated from each other by gaps. The percolated region size can be at least several lattice constants measured in the basal plane of the semiconductor lattice (e.g., group III nitride) and gaps can be at least two lattice constants measured in a basal plane. Alternatively, gaps can be steps between several basal planes. Further, a region (e.g., the set of higher conductive regions) is said to be percolated if, for any two atoms in the region, there is a conductive path connecting these atoms that lies entirely in the region.

The transparent and conductive regions can be formed using any solution. For example, the layer 22 can be grown using migration-enhanced metalorganic chemical vapor deposition (MEMOCVD). During the growth, inhomogeneities in the lateral direction of a molar fraction of one or more elements, such as aluminum, gallium, indium, boron, and/or the like, can be allowed of the layer 22. In an embodiment, such compositional inhomogeneities can vary by at least one percent.

Furthermore, the layer 22 can have a non-uniform distribution of a thickness of one or more of the barriers in the SPSL. The non-uniform distribution can be configured to create the transparent regions and the higher conductive regions. In an embodiment, the non-uniform distribution is accomplished by growing a film under a facetted or three-dimensional growth mode. This growth mode is achieved while growing under conditions where the growth rate of the film is determined by the arrival rate of active nitrogen (N-limited). Furthermore, this growth mode is achieved by growing under nearly stoichiometric conditions where the ratio of the arrival rate of group-III atoms (Al, Ga) and the arrival rate of active nitrogen is about unity. Moreover, the nanometer scale compositional inhomogeneities are self-assembled within the film as a result of such a growth mode.

In an embodiment, an illustrative process can be implemented to provide a growth mode for producing an $Al_xGa_{1-x}N$ alloy film, which can be utilized as a p-type layer in an emitting device. Such a growth mode can be defined by substrate temperature, a ratio of the group V/group III elements, doping concentration, and/or the like. For example, the substrate temperature can be between approximately 750 and approximately 1300 degrees Celsius. Additionally, an inhomogeneous distribution of aluminum can be obtained by controlling a density of screw dislocations present in the material. The density of the screw dislocations can be controlled, for example, by alternating the group V/group III element ratio in the SPSL layers. The group V/group III element ratio can be in a range of ratios between approximately 20 and approximately 10000.

Still further, the growth of the layer 22 can allow a non-uniform compositional distribution along the barrier height and/or barrier thickness. Even further, when the layer 22 is doped, the growth of the layer 22 can allow a non-uniform doping distribution along the barrier height and/or barrier thickness. For example, modulation doping of the layer 22 can be utilized to create a variation of acceptor concentration within the layer that exceeds approximately $1 \times 10^{18}$ $1/cm^3$.

In an embodiment, an SPSL layer described herein can be formed directly on an inhomogeneous layer (e.g., p-type layer 20 shown in FIG. 2), which can promote the SPSL semiconductor layer (e.g., layer 22 shown in FIG. 2) to form the transparent and conductive regions. The inhomogeneous layer can be grown in a similar manner as the SPSL semiconductor layer and also include transparent and conductive regions as described herein. However, the growth temperature of the inhomogeneous layer can be at least approximately two hundred degrees Celsius lower than the growth temperature used for growing the SPSL semiconductor layer. Furthermore, a thickness of the inhomogeneous layer can be less than approximately 20 nanometers. In an embodiment, the growth of the inhomogeneous layer can include: enabling the three dimensional (e.g., side and upward) coalescence of islands (e.g., of Al), which are grown at a temperature approximately two hundred degrees Celsius lower than the temperature used for growing the SPSL semiconductor layer; followed by two dimensional growth of the inhomogeneous layer around the islands using distinctly different growth conditions than during the formation of the islands. For example, the two dimensional growth can be at a temperature and/or a group V/group III element ratio comparable to that used for growing the SPSL semiconductor layer. The growth of islands followed by two dimensional growth can be repeated one or more times to form the inhomogeneous layer. While use of MEMOCVD is described herein, it is understood that growth of one or more of the layers can utilize another growth solution, such as metallo organic chemical vapor deposition (MOCVD), molecular beam epitaxy (MBE, as utilized in U.S. Pat. No. 7,812,366), and/or the like.

Figure 4:
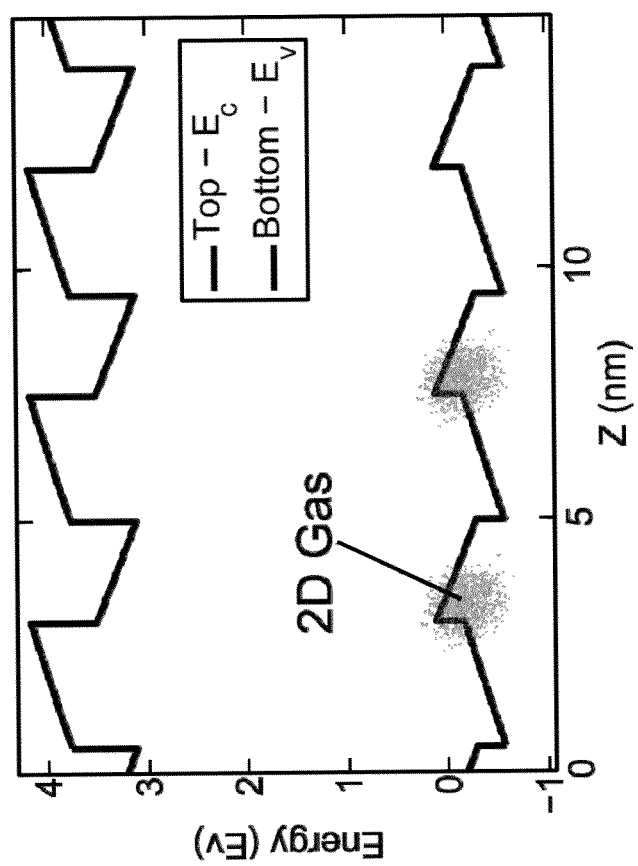
FIG. 4 shows an illustrative band variation for a p-type superlattice according to an embodiment.

FIG. 4 shows an illustrative band variation for a p-type superlattice, such as the layer 22 shown in FIGS. 3A and 3B, according to an embodiment. Built in polarization fields result in the skewed band levels. The skewed band levels lead to the localization of carriers. For cases when doping is relatively small in the superlattice quantum wells, but relatively high in the barriers, acceptor ionization in the barriers is possible and can result in a large concentration of holes in the quantum wells, which leads to the formation of a two-dimensional carrier gas illustrated by the grey "clouded" regions of FIG. 4. In an embodiment, the quantum wells have a concentration less than $5 \cdot 10^{17} [1/cm^3]$ (e.g., a concentration less than $5 \cdot 10^{15}$ $[1/cm^3]$), while the barriers have a concentration greater than $5 \cdot 10^{17}$ $[1/cm^3]$ (e.g., a concentration higher than $5 \cdot 10^{18}$ $[1/cm^3]$).

The carrier path through the layer 22 (FIGS. 3A and 3B) is composed of a diffusive lateral component due to the high mobility of carriers in the lateral direction, barrier tunneling, and/or penetration through conducting channels in a direction normal to the semiconductor layer 22. FIG. 5 shows a schematic representation of an illustrative carrier path in a complicated energy landscape caused by the inhomogeneities according to an embodiment. As illustrated, the carrier path runs through the low energy valleys (e.g., higher conductivity regions) of the energy landscape (indicated by dark regions), and propagates through regions containing a high concentration of dopants. In these valleys and regions, the electrons and holes experience smaller energy barriers, which they can penetrate through using the low energy valleys. In an embodiment, a characteristic distance between the higher conducting regions is less than a lateral current spreading length within the layer. For example, the lateral current spreading length can be 0.1 μm or larger.

Figure 6:
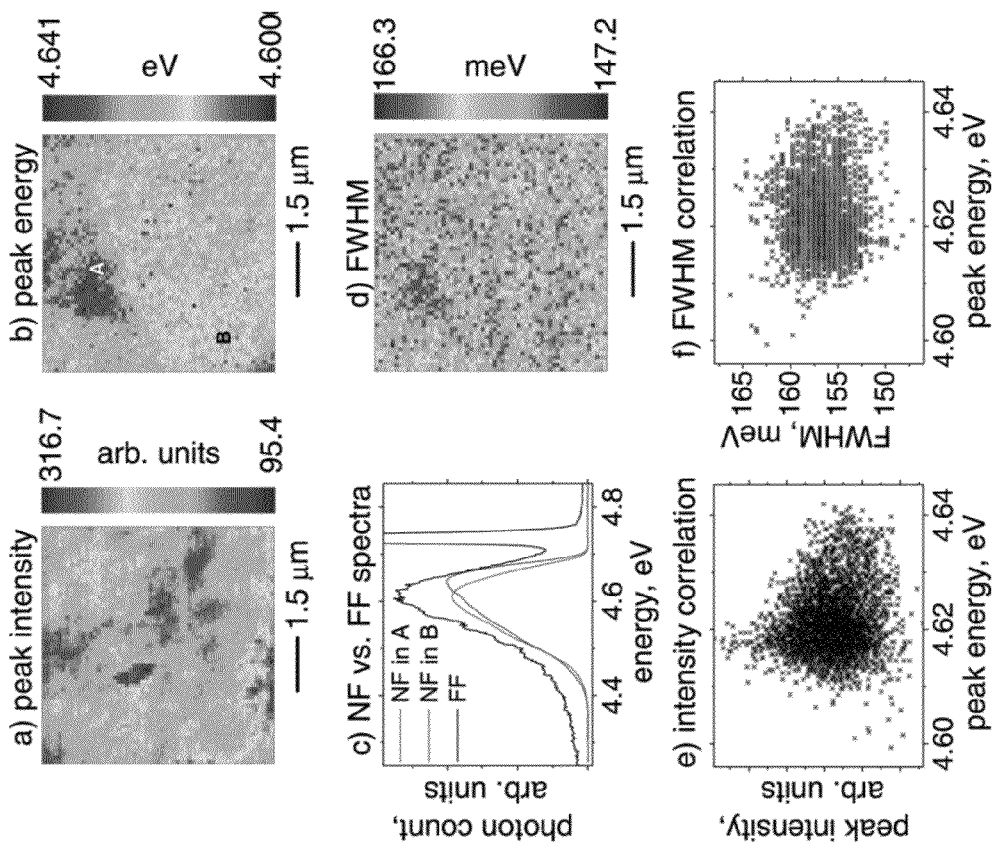
FIG. 6 shows illustrative maps corresponding to an $Al_{50}Ga_{50}N$ layer.

FIG. 6 shows illustrative maps corresponding to an $Al_{50}Ga_{50}N$ layer. In particular, FIG. 6 includes: a) a near-field photoluminescence map of the peak intensity; b) a near-field photoluminescence map of the peak energy; d) a near-field photoluminescence map of the full width at half maximum (FWHM); c) a map of near-field and far-field spectra; e) a map of intensity correlation; and f) a map of FWHM correlation. As illustrated, the emission is non-uniform throughout the active layer structure and includes high intensity red shifted regions, which are correlated to islands containing lower aluminum content than the surrounding area.

A theoretical basis for the devices described herein is included for clarity. However, it is understood that the invention is not limited to the inventor's current understanding of the benefits described herein or the basis for such benefits.

The overall wall plug efficiency of a light emitting device, such as device 10 (FIG. 2), is related to tradeoffs associated with the conductivity and the transparent characteristics of the semiconductor layers. In particular, the p-type cladding layer(s) can have a low conductivity and highest absorption coefficient compared to all other layers in a deep ultraviolet LED. Consider the total resistance of the device 10 as a sum of a resistance due to p-type cladding layer(s) ($R_p$) and a resistance due to all other components of the device 10, such as the resistances of the active region 18, n-type cladding layer 16, the contact resistances, and/or the like ($R_r$). The total voltage ($V_T$) across the device 10 is given by:

$$V_T = V_{on} + I(R_r + R_p)$$

With $V_{on}$ being a turn on voltage and I being the current. The total power dissipated ($P_{dis}$) on a device 10 is:

$$P_{dis} = IV_T = I^2(R_p + R_r) + IV_{on}$$

A device 10, such as a light emitting diode, described herein can operate at a set current I. Furthermore, assume that $R_r$ is fixed and known. The resistivity of a p-type contact layer, $R_p$, can be written as:

$$\frac{1}{R_p} = \frac{1}{R_1} + \frac{1}{R_2}$$

Here, $R_1$ is a portion of the p-type superlattice (PSL) 22 (FIGS. 3A and 3B) with a relatively low resistance and a relatively low transparency, while $R_2$ is a part of the PSL lattice with a relatively high resistance and a relatively high transparency. For cases when $R_1 \ll R_2$, it is sufficient to approximate $R_p \sim R_1$. This simple model assumes that most of the conduction in the p-type superlattice 22 happens through channels, which are connected domains with a lower concentration of aluminum and a higher concentration of dopants. Regions of the PSL 22 with a low resistance can be described by their characteristic resistivity $\rho_1$, as well as the gross cross sectional area that corresponds to these regions (further denoted as $A_1$); thus:

$$R_1 = \rho_1 L_{PSL}/A_1.$$

Here $L_{PSL}$ denotes the corresponding length of the layer. Using $f = A_1/A$, where A is a total area of a device, then:

$$R_1 = [(\rho_1 L_{PSL})/A](1/f) = R_0/f.$$

As a simple approximation, the resistance $R_0$ can be taken to be the resistance of a p-type contact layer composed of bulk GaN semiconductor material.

Figure 7:
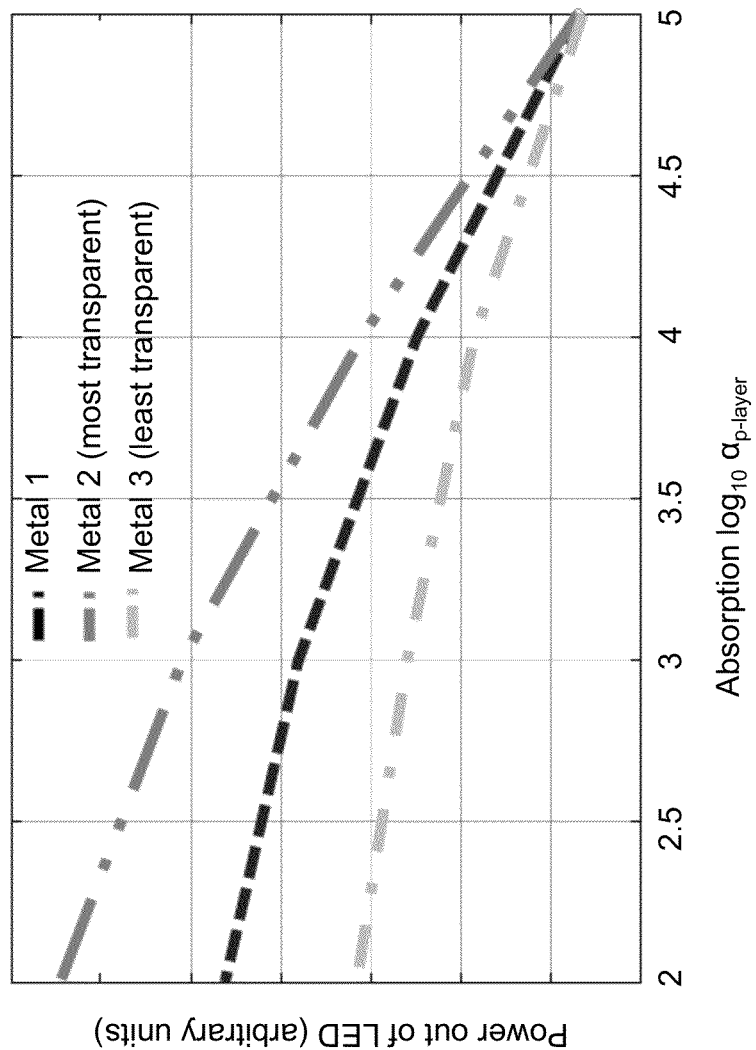
FIG. 7 shows the effect of the absorption coefficient of a p-type superlattice layer on the total extracted light from an illustrative light emitting diode structure according to an embodiment.
Figure 8:
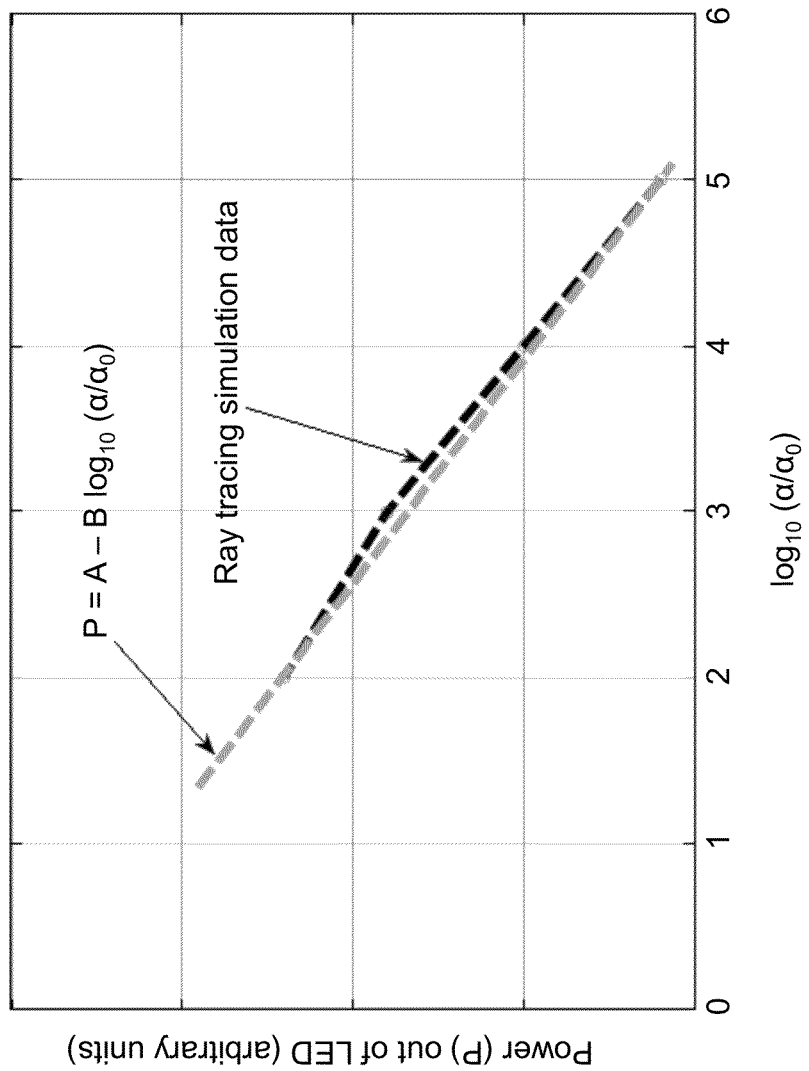
FIG. 8 shows a numerical fit to the ray tracing data shown in FIG. 7 according to an embodiment.

FIG. 7 shows the effect of the absorption coefficient of the PSL layer 22 on the total extracted light from an illustrative light emitting diode structure according to an embodiment. The effect is shown in the context of a deep ultraviolet LED, and was obtained through ray tracing simulations. As illustrated, the total radiative power of the LED depends roughly linearly on $\log_{10}(\alpha/\alpha_0)$, with $\alpha_0$ being a normalization parameter. FIG. 8 shows a numerical fit to the ray tracing data according to an embodiment. Radiative power is then written as:

$$P_{out} = A - B \log_{10}(\alpha/\alpha_0)$$

where A, and B are fitting constants.

The transmittance of a layer is related to the absorption coefficient and the p-type cladding layer as:

$$T = T_0 \exp(-\alpha L_{PSL})$$

If a part of the area of a p-type cladding layer is not substantially transparent but is more conductive (this area is $A_1$), then the total transmission is given by (under an assumption of a uniform light flux per unit area):

$$T_{tot} = T\left(1 - \frac{A_1}{A}\right) = T(1-f) = T_0 \exp(-\alpha' L_{PSL})$$

Here $\alpha'$ is a modification of the absorption coefficient due to area $A_1$ not being transparent. From this it follows that:

$$\exp(-\alpha L_{PSL})(1-f) = \exp(-\alpha L_{PSL}) \text{ or } \alpha' = \alpha - \log(1-f)/L_{PSL}$$

Using the expression for $P_{out}$, with $\alpha' = \alpha'$ (f;$\alpha$):$P_{out} = A - B \log_{10}(\alpha'/\alpha_0)$ and we can calculate the wall plug efficiency as:

$$WPE(f) = P_{out}(f)/P_{dis}(f).$$

Figure 9:
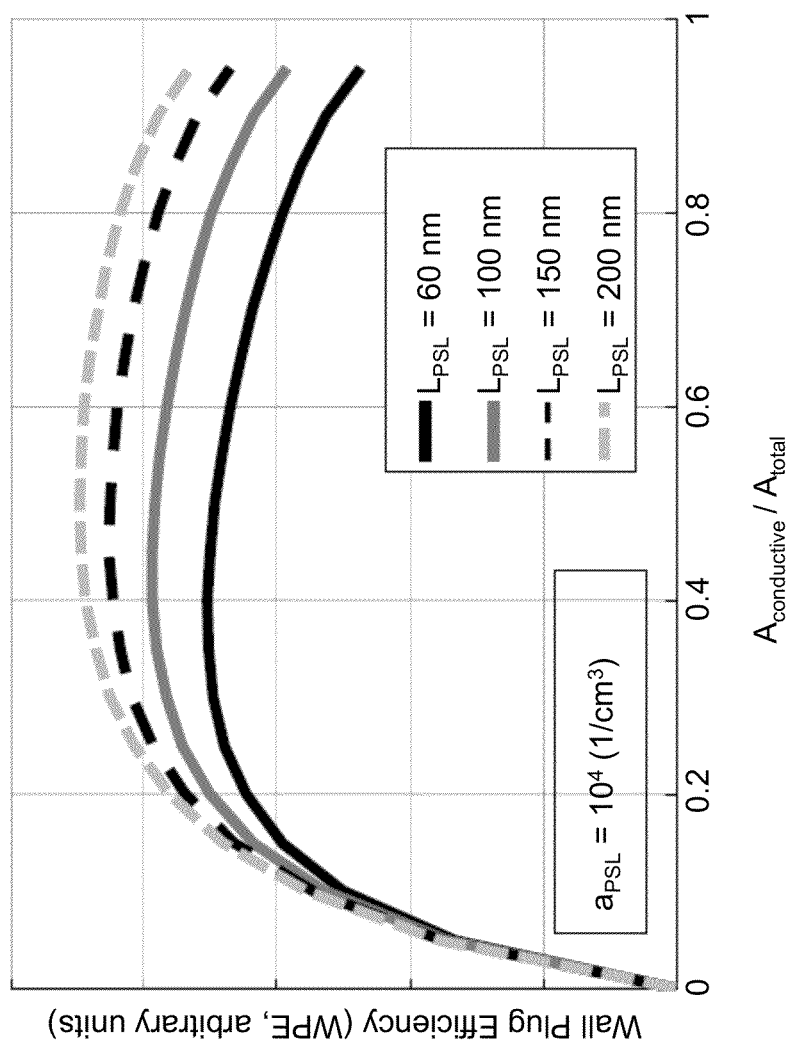
FIG. 9 shows a plot of the wall plug efficiency as a function of the conductance area fraction for typical light emitting diode materials according to an embodiment.

Wall plug efficiency can have a maximum for a particular value of f and can depend on the resistivity of the device, a thickness of the PSL, and the absorption coefficient $\alpha$. FIG. 9 shows a plot of the WPE as a function of the conductance area fraction, f, for typical LED materials according to an embodiment. As illustrated, a peak wall plug efficiency is obtained at a value of the conductance area fraction f between approximately 0.3 and 0.6. In an embodiment, a total area of the set of transparent regions in a lateral cross section of the PSL is at least ten percent (f=0.1) of the total area of the lateral cross section. In a more particular embodiment, the total area of the set of transparent regions is between approximately thirty and sixty percent of the total area of the lateral cross section.

It is important to observe that the average distance between inhomogeneities should be on the order of current spreading length in order for the device to have uniform current/light emission throughout the semiconducting layers. Current spreading length in one period of a PSL is given by:

$$L_{spread} = \sqrt{\frac{lkT}{q\rho J_0}},$$

where l is the thickness of a period layer, $\rho$ is the resistivity of a current spreading layer, and $J_0$ is a current density. Using this formula, the current spreading length is estimated to be between approximately 0.1 μm and approximately 1 μm.

As discussed herein, the set of higher conductive regions can be configured to keep the voltage drop across the layer within a desired range. In an embodiment, a target resistance per area for the layer can be calculated based on attributes of the layer and attributes of the operating environment for the device. For example, an illustrative device configuration can include a layer that is 200 nanometers thick and has a lateral cross sectional area of 200 micrometers by 200 micrometers, a target voltage drop of one Volt across the layer, and an operating current of 0.02 Amperes. In this case, a target total resistance of the layer can be calculated as 1 Volt/0.02 Amps=50 Ohms, and a target resistivity of the layer can be calculated as:

$$50 \text{ Ohms} \times 4 \times 10^{-8}/(2 \times 10^{-7}) = 10 \text{ Ohm·m}.$$

Using a target resistivity of 1000 Ohm*cm, a target resistance per area of a 200 nanometer thick layer can be calculated as:

$$1000 \text{ Ohm·cm} \times 2 \times 10^{-5} \text{ cm} = 2 \times 10^{-2} \text{ Ohm·cm}^2.$$

Figure 10:
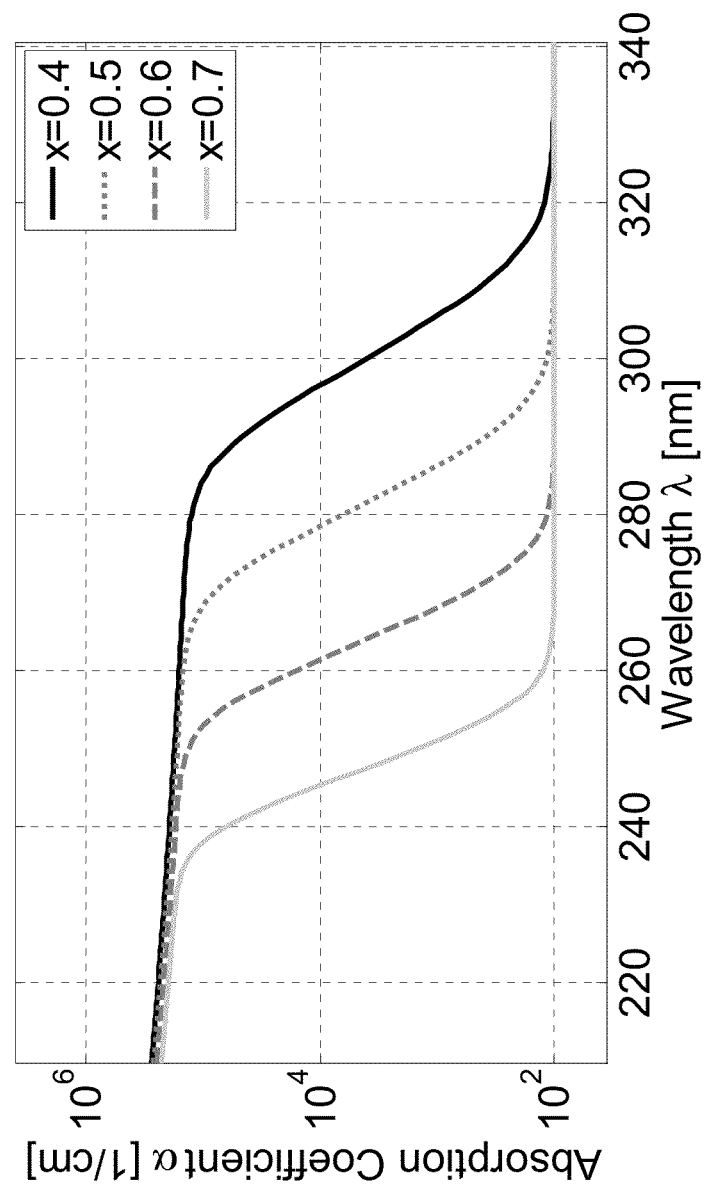
FIG. 10 shows a typical dependence of the absorption coefficient on the wavelength for various aluminum molar fractions in a $Al_xGa_{1-x}N$ alloy according to an embodiment.
Figure 11:
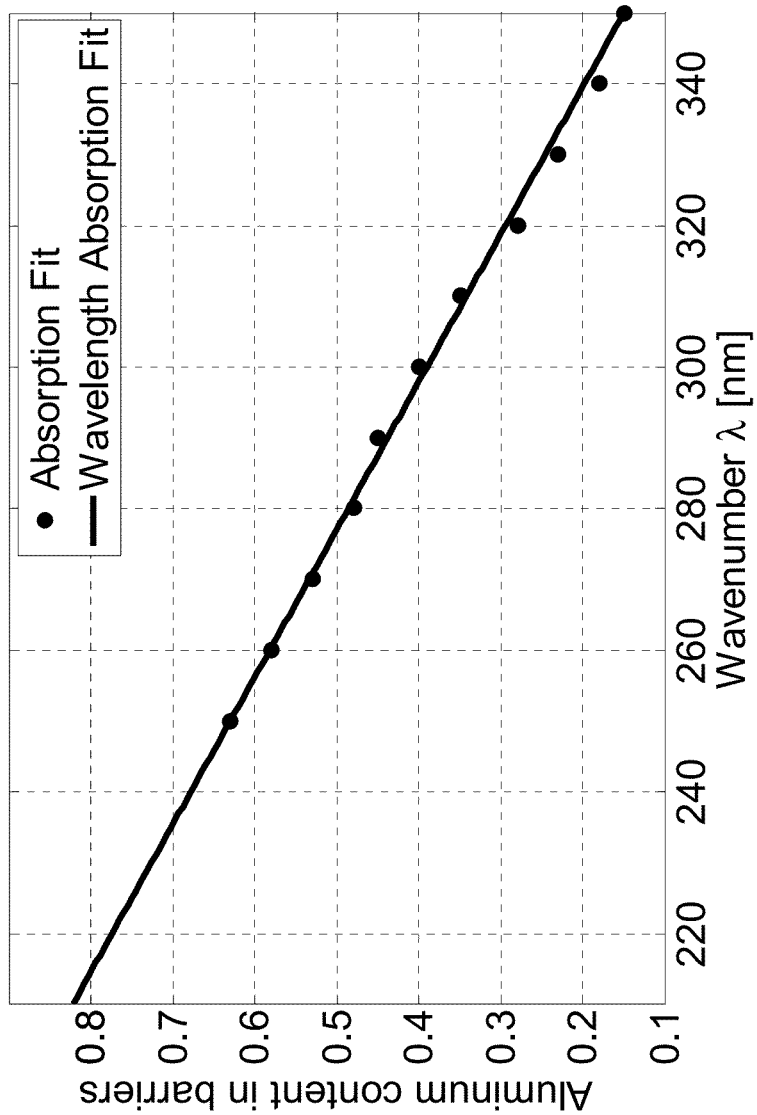
FIG. 11 shows how the content of the aluminum can be chosen for each emitted wavelength according to an embodiment.

The transparency of a short period superlattice (SPSL) can be calculated by either averaging the optical absorption and refraction coefficients of the SPSL or computing absorption and reflection coefficients numerically using Maxwell equations. The absorption coefficients, $\alpha$, depend on the absorption edge of the semiconductor material which is a function of the molar fractions x, y, and z of a $Ga_z In_y Al_x B_{1-x-y-z} N$ semiconductor alloy for a group III nitride semiconductor material. FIG. 10 shows a typical dependence of the absorption coefficient on the wavelength for various aluminum molar fractions in a $Al_x Ga_{1-x} N$ alloy according to an embodiment. In order to maintain a target absorption coefficient of a p-type layer at orders of $10^4$ inverse centimeters, the content of aluminum in the SPSL barriers can be carefully chosen for each emitted wavelength. FIG. 11 shows how the content of the aluminum can be chosen for each emitted wavelength according to an embodiment. Note that the dependence of $x = x(\lambda)$ is linear, with $$x = -0.0048\lambda + 1.83.$$

To this extent, x can provide a threshold value for a molar fraction of aluminum, which can be selected to be approximately equal to or exceed the threshold value.

It is understood that aspects of the invention can be incorporated into various types of structures/devices, solutions for designing the various types of structures/devices, and/or solutions for fabricating the various types of structures/devices.

For example, an embodiment of the invention can be implemented as part of a solution for designing and/or fabricating a structure and/or a resulting device/structure as described in U.S. patent application Ser. No. 12/987,102, titled "Superlattice Structure," which was filed on 8 Jan. 2011, and which claims the benefit of U.S. Provisional Application No. 61/293,614, titled "Superlattice Structures and Devices," which was filed on 8 Jan. 2010, both of which are hereby incorporated by reference. Similarly, an embodiment of the invention can be implemented as part of a solution for designing and/or fabricating a structure and/or a resulting device/structure as described in U.S. patent application Ser. No. 13/162,895, titled "Superlattice Structure," which was filed on 17 Jun. 2011, which is hereby incorporated by reference. In either case, the structure/device can comprise a superlattice layer including a plurality of periods, each of which is formed from a plurality of sub-layers. Each sub-layer comprises a different composition than the adjacent sub-layer(s) and comprises a polarization that is opposite a polarization of the adjacent sub-layer(s). Furthermore, one or more of the sub-layers can comprise lateral region(s) configured to facilitate the transmission of radiation, such as ultraviolet radiation, through the layer and lateral region(s) configured to facilitate current flow through the sub-layer as described herein.

Furthermore, an embodiment of the invention can be implemented as part of a solution for designing and/or fabricating a structure and/or a resulting device/structure as described in U.S. patent application Ser. No. 12/960,476, titled "Semiconductor Material Doping," which was filed on 4 Dec. 2010, and which claims the benefit of U.S. Provisional Application No. 61/266,523, titled "Method of Doping and Semiconductor Devices," which was filed on 4 Dec. 2009, both of which are hereby incorporated by reference. Similarly, an embodiment of the invention can be implemented as part of a solution for designing and/or fabricating a structure and/or a resulting device/structure as described in U.S. patent application Ser. No. 13/162,908, titled "Semiconductor Material Doping," which was filed on 17 Jun. 2011, which is hereby incorporated by reference. In either case, the structure/device can comprise a superlattice structure as described herein, in which a target band discontinuity between a quantum well and an adjacent barrier is selected to coincide with an activation energy of a dopant for the quantum well and/or barrier. For example, a target valence band discontinuity can be selected such that a dopant energy level of a dopant in the adjacent barrier coincides with a valence energy band edge for the quantum well and/or a ground state energy for free carriers in a valence energy band for the quantum well. Additionally, a target doping level for the quantum well and/or adjacent barrier can be selected to facilitate a real space transfer of holes across the barrier. The quantum well and the adjacent barrier can be formed such that the actual band discontinuity and/or actual doping level(s) correspond to the relevant target(s).

Furthermore, an embodiment of the invention can be implemented as part of a solution for designing and/or fabricating a structure and/or a resulting device/structure as described in U.S. patent application Ser. No. 13/161,961, titled "Deep Ultraviolet Light Emitting Diode," which was filed on 16 Jun. 2011, and which claims the benefit of U.S. Provisional Application No. 61/356,484, titled "Deep Ultraviolet Light Emitting Diode," which was filed on 18 Jun. 2010, both of which are hereby incorporated by reference. In this case, the structure/device, such as a light emitting diode, can include an n-type contact layer and a light generating structure, which includes a set of quantum wells, adjacent to the n-type contact layer. The contact layer and light generating structure can be configured so that a difference between an energy of the n-type contact layer and an electron ground state energy of a quantum well is greater than an energy of a polar optical phonon in a material of the light generating structure. Additionally, the light generating structure can be configured so that its width is comparable to a mean free path for emission of a polar optical phonon by an electron injected into the light generating structure. The diode can include a blocking layer, which is configured so that a difference between an energy of the blocking layer and the electron ground state energy of a quantum well is greater than the energy of the polar optical phonon in the material of the light generating structure. The diode can include a composite contact, including an adhesion layer, which is at least partially transparent to light generated by the light generating structure and a reflecting metal layer configured to reflect at least a portion of the light generated by the light generating structure. The n-type contact layer, light generating structure, blocking layer, and/or composite contact can include a superlattice configured as shown and described herein.

While shown and described herein as a method of designing and/or fabricating an emitting device to improve extraction of light from the device, it is understood that aspects of the invention further provide various alternative embodiments. For example, aspects of the invention can be implemented to facilitate the transmission of light within the device, e.g., as part of optical pumping of a laser light generating structure, excitation of a carrier gas using a laser pulse, and/or the like. Similarly, an embodiment of the invention can be implemented in conjunction with a sensing device, such as a photosensor or a photodetector. In each case, a profiled surface can be included in an exterior surface of the device and/or an interface of two adjacent layers of the device in order to facilitate the transmission of light through the interface in a desired direction.

Figure 12:
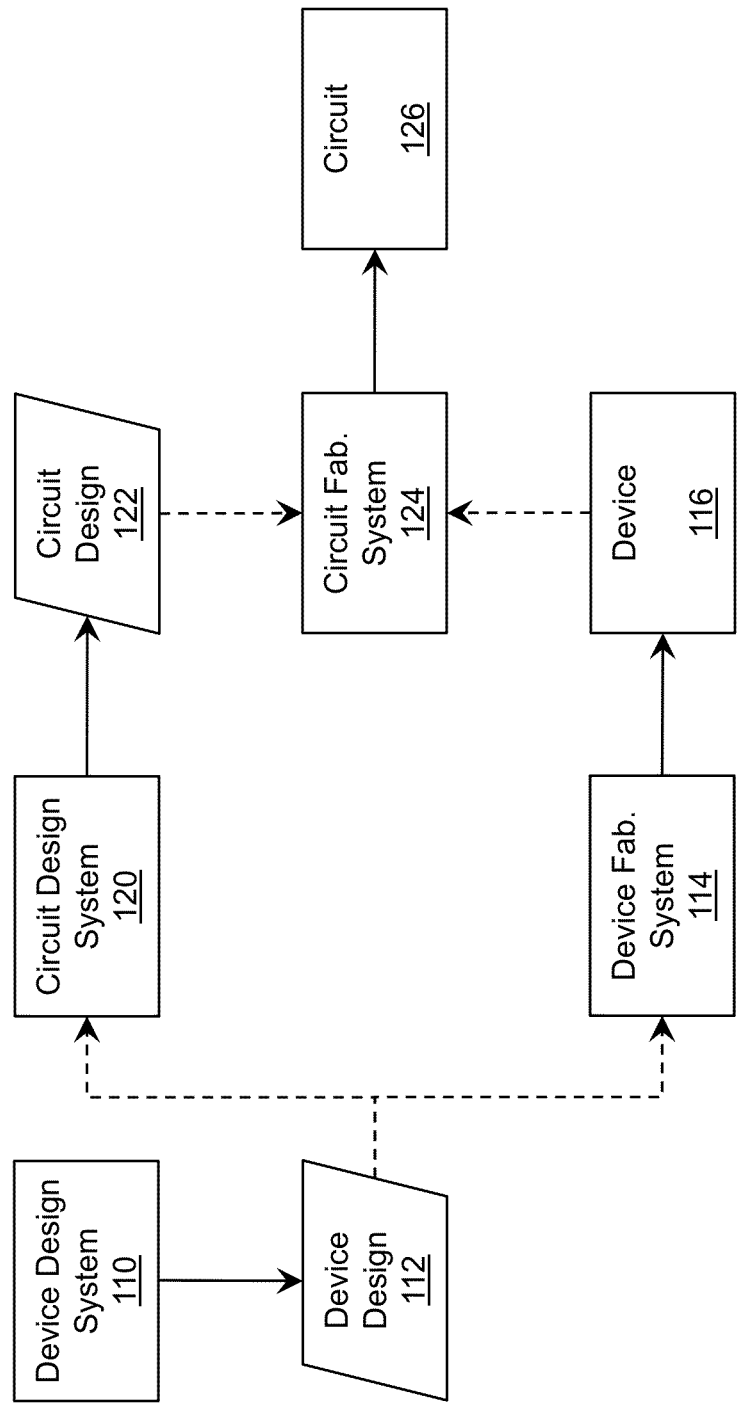
FIG. 12 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 12 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
a short period superlattice (SPSL) semiconductor layer, wherein a composition of at least one barrier in the SPSL semiconductor layer varies along lateral dimensions of the at least one barrier such that a lateral cross section of the at least one barrier includes:
a set of transparent regions having a first characteristic band gap, wherein the set of transparent regions are at least ten percent of an area of the lateral cross section of the at least one barrier; and
a set of higher conductive regions having a second characteristic band gap at least five percent smaller than the first characteristic band gap, wherein the set of higher conductive regions are at least two percent of the area of the lateral cross section of the at least one barrier, and wherein lateral inhomogeneities in at least one of: the composition or a doping of the at least one barrier forms the set of transparent regions and the set of higher conductive regions.

2. The device of claim 1, wherein the SPSL semiconductor layer comprises a periodic structure including a plurality of periods, wherein at least one of: a composition or a width of each period varies along the height of the SPSL semiconductor layer.

3. The device of claim 2, wherein at least one of: a composition or a width of each period varies aperiodically from period to period in the SPSL semiconductor layer.

4. The device of claim 1, wherein at least one barrier in the SPSL semiconductor layer has a graded composition.

5. The device of claim 4, wherein the graded composition is a group III-V material having a varying aluminum molar fraction.

6. The device of claim 1, wherein at least one well in the SPSL semiconductor layer has a graded composition.

7. The device of claim 1, wherein the set of transparent regions have an average transmission coefficient for radiation of a target wavelength of at least fifty percent.

8. The device of claim 7, wherein the device is configured to emit radiation of the target wavelength during operation.

9. The device of claim 1, wherein the set of higher conductive regions have an average resistance per unit area to vertical current flow smaller than approximately $10^{-2}$ ohm·cm$^2$.

10. The device of claim 1, wherein the SPSL semiconductor layer is a p-type layer, and wherein the at least one barrier includes lateral inhomogeneities in a p-type doping of the at least one barrier.

11. The device of claim 1, wherein the SPSL semiconductor layer is an n-type layer, and wherein the at least one barrier includes lateral inhomogeneities in an n-type doping of the at least one barrier.

12. The device of claim 1, wherein the set of higher conductive regions form an interconnected network of conductive paths.

13. The device of claim 1, further comprising an inhomogeneous layer directly adjacent to the SPSL semiconductor layer, wherein the inhomogeneous layer includes a plurality of transparent regions and a plurality of higher conductive regions.

14. The device of claim 1, further comprising a semiconductor layer having a graded composition directly adjacent to the SPSL semiconductor layer.

15. An emitting device comprising:
an active region configured to generate electromagnetic radiation having a target wavelength; and
a short period superlattice (SPSL) semiconductor layer, wherein a composition of a plurality of barriers in the SPSL semiconductor layer varies along lateral dimensions of each of the plurality of barriers such that a lateral cross section of each barrier includes:
- a set of transparent regions having a first characteristic band gap, wherein the set of transparent regions are at least ten percent of an area of the lateral cross section of the barrier and have an average transmission coefficient for radiation of the target wavelength of at least fifty percent; and
- a set of higher conductive regions having a second characteristic band gap at least five percent smaller than the first characteristic band gap, wherein the set of higher conductive regions are at least two percent of the area of the lateral cross section of the barrier, and wherein the set of higher conductive regions have an average resistance per unit area to vertical current flow smaller than approximately $10^{-2}$ ohm·cm$^2$.

16. The device of claim 15, wherein lateral inhomogeneities in at least one of: the composition or a doping of the barrier forms the set of transparent regions and the set of higher conductive regions.

17. The device of claim 16, wherein the SPSL semiconductor layer is a p-type layer.

18. The device of claim 15, further comprising an inhomogeneous layer directly adjacent to the SPSL semiconductor layer, wherein the inhomogeneous layer includes a plurality of transparent regions and a plurality of higher conductive regions.

19. The device of claim 15, further comprising a graded semiconductor layer having a graded composition directly adjacent to the SPSL semiconductor layer.

20. The device of claim 19, wherein the graded semiconductor layer is a p-type blocking layer and the SPSL semiconductor layer is a p-type cladding layer.

21. An emitting device comprising:
an active region configured to generate electromagnetic radiation having a target wavelength; and
a short period superlattice (SPSL) semiconductor layer, wherein a composition of a plurality of barriers in the SPSL semiconductor layer varies along lateral dimensions of each of the plurality of barriers such that a lateral cross section of each barrier includes:
- a set of transparent regions having a first characteristic band gap, wherein the set of transparent regions are at least ten percent of an area of the lateral cross section of the barrier and have an average transmission coefficient for radiation of the target wavelength of at least fifty percent; and
- a set of higher conductive regions having a second characteristic band gap at least five percent smaller than the first characteristic band gap, wherein the set of higher conductive regions are at least two percent of the area of the lateral cross section of the barrier, and wherein the set of higher conductive regions have an average resistance per unit area to vertical current flow smaller than approximately $10^{-2}$ ohm·cm$^2$, wherein the active region and the SPSL semiconductor layer are formed of group III-V materials.

22. The emitting device of claim 21, wherein the group III-V materials are group III nitride materials.

23. The emitting device of claim 21, wherein the set of transparent regions have an aluminum content at least one percent higher than an aluminum content of the set of higher conductive regions.

* * * * *